(12) United States Patent
Takano et al.

(10) Patent No.: US 9,417,530 B2
(45) Date of Patent: Aug. 16, 2016

(54) METHOD FOR DEVELOPING RESIST, METHOD FOR FORMING A RESIST PATTERN, METHOD FOR PRODUCING A MOLD, AND DEVELOPING FLUID UTILIZED IN THESE METHODS

(71) Applicant: FUJIFILM Corporation, Minato-ku, Tokyo (JP)

(72) Inventors: Ikuo Takano, Haibara-gun (JP); Toru Tsuchihashi, Haibara-gun (JP); Tomokazu Seki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/497,616

(22) Filed: Sep. 26, 2014

(65) Prior Publication Data

US 2015/0008211 A1 Jan. 8, 2015

Related U.S. Application Data

(63) Continuation of application No. PCT/JP2013/002011, filed on Mar. 25, 2013.

(30) Foreign Application Priority Data

Mar. 30, 2012 (JP) ................................ 2012-078659

(51) Int. Cl.
*G03F 7/004* (2006.01)
*G03F 7/32* (2006.01)
(Continued)

(52) U.S. Cl.
CPC ................ *G03F 7/32* (2013.01); *G03F 7/0002* (2013.01); *G03F 7/0017* (2013.01); *G03F 7/039* (2013.01); *G03F 7/325* (2013.01); *G11B 5/82* (2013.01); *H01L 21/0337* (2013.01)

(58) Field of Classification Search
CPC ..... G03F 7/0002; G03F 7/0017; G03F 7/039; G03F 7/32; G03F 7/325; G03F 7/331; H01L 21/0337; H01L 21/0274; G11B 5/82; G11B 5/865
USPC .................................. 430/321, 322, 325, 331
See application file for complete search history.

(56) References Cited

U.S. PATENT DOCUMENTS 4,752,635 A * 6/1988 Tsutsumi et al. ............. 524/545
5,354,645 A * 10/1994 Schober et al. ............... 430/306
(Continued)

FOREIGN PATENT DOCUMENTS

EP          355789 A  *  2/1990
JP      61-249049 A     11/1986
(Continued)

OTHER PUBLICATIONS

Machine translation of JP 2009-226762 (no date).*
(Continued)

*Primary Examiner* — Amanda C Walke
(74) *Attorney, Agent, or Firm* — Sughrue Mion, PLLC

(57) ABSTRACT

A method for developing a non chemically amplified resist employs a developing fluid having a carboxylic acid compound, which is a carboxylic acid ester having branched chain alkyl groups and a total carbon number of 8 or greater, as a main component. It is particularly preferable for the carboxylic acid compound to be at least one of isobutyl butyrate, butyl isobutyrate, isobutyl isobutyrate, isoamyl isobutyrate, and 2-methylbutyrate 2-methylbutyl. It is also preferable for the non chemically amplified resist to be a resist having a copolymer of an α-chloroacrylate ester compound and an α-methylstyrene compound as a main component.

20 Claims, 3 Drawing Sheets

(51) Int. Cl.
*H01L 21/033* (2006.01)
*G11B 5/82* (2006.01)
*G03F 7/039* (2006.01)
*G03F 7/00* (2006.01)

(56) References Cited

U.S. PATENT DOCUMENTS

| | | | |
|---|---|---|---|
| 6,221,568 B1 * | 4/2001 | Angelopoulos et al. | 430/331 |
| 6,511,792 B2 * | 1/2003 | Fujino et al. | 430/311 |
| 6,541,182 B1 | 4/2003 | Louis Joseph Dogue et al. | |
| 7,833,957 B2 * | 11/2010 | Itano et al. | 510/175 |
| 8,822,134 B2 * | 9/2014 | Iyama et al. | 430/296 |
| 2001/0018166 A1 | 8/2001 | Fujino et al. | |
| 2007/0048625 A1 * | 3/2007 | Nordquist et al. | 430/5 |
| 2008/0062548 A1 * | 3/2008 | Fujiwara et al. | 360/17 |
| 2012/0219755 A1 * | 8/2012 | Bae et al. | 428/141 |
| 2012/0219901 A1 * | 8/2012 | Bae et al. | 430/270.1 |
| 2013/0004724 A1 * | 1/2013 | Kashiwada et al. | 428/167 |
| 2014/0038102 A1 * | 2/2014 | Park et al. | 430/270.1 |
| 2014/0227636 A1 * | 8/2014 | Hirano et al. | 430/9 |
| 2014/0234762 A1 | 8/2014 | Yamaguchi et al. | |

FOREIGN PATENT DOCUMENTS

| | | | |
|---|---|---|---|
| JP | 04-500278 A | | 1/1992 |
| JP | 05-045892 A | | 2/1993 |
| JP | 2000039717 A | * | 2/2000 |
| JP | 2002-57104 A | | 2/2002 |
| JP | 3779882 B2 | | 5/2006 |
| JP | 2006-227174 A | | 8/2006 |
| JP | 2009226762 A | * | 10/2009 |
| JP | 2011-215242 A | | 10/2011 |
| JP | 2012-150441 A | | 8/2012 |
| JP | 2013-101270 A | | 5/2013 |

OTHER PUBLICATIONS

Machine translation of JP 2001-318472 (no date).*
Machine translation of JP 2000-039717 (no date).*
L. E. Ocola, et al., "Effect of cold development on improvement in electron-beam nanopatterning resolution and line roughness", Journal of Vacuum Science & Technology B, 2006, pp. 3061-3065, vol. 24, No. 6.
H. Wang, et al., "Low temperature ZEP-520A development process for enhanced critical dimension realization in reactive ion etch etched polysilicon", Journal of Vacuum Science & Technology B, 2007, pp. 102-105, vol. 25, No. 1.
T. Yamaguchi, et al., "Effect of developer molecular size on roughness of dissolution front in electron-beam resist", Journal of Vacuum Science & Technology B, 2004, pp. 1037-1043, vol. 22, No. 3.
Internal Search Report for PCT/JP2013/002011 dated Jul. 2, 2013 [PCT/ISA/210].
Written Opinion for PCT/JP2013/002011 dated Jul. 2, 2013 [PCT/ISA/237].
Communication dated May 19, 2015, issued by the Japan Patent Office in corresponding Japanese Application No. 2012-078659.
Communication dated Nov. 4, 2015 from the Japanese Patent Office in counterpart application No. 2012-078659.
Communication dated Dec. 21, 2015 from the Japanese Patent Office issued in corresponding Application No. 2012-78659.
Kazuyuki Enomoto et al., Reaction Mechanism of Chemically Amplified Methacrylate Ester Resist when Irradiated with EUV and EB, Japanese Journal of Applied Physics (2012) 51, http://www.jst.go.ip/kisoken/crest/research/s-houkoku/h24_0605tagawa.pdf, 42 pages total.

* cited by examiner

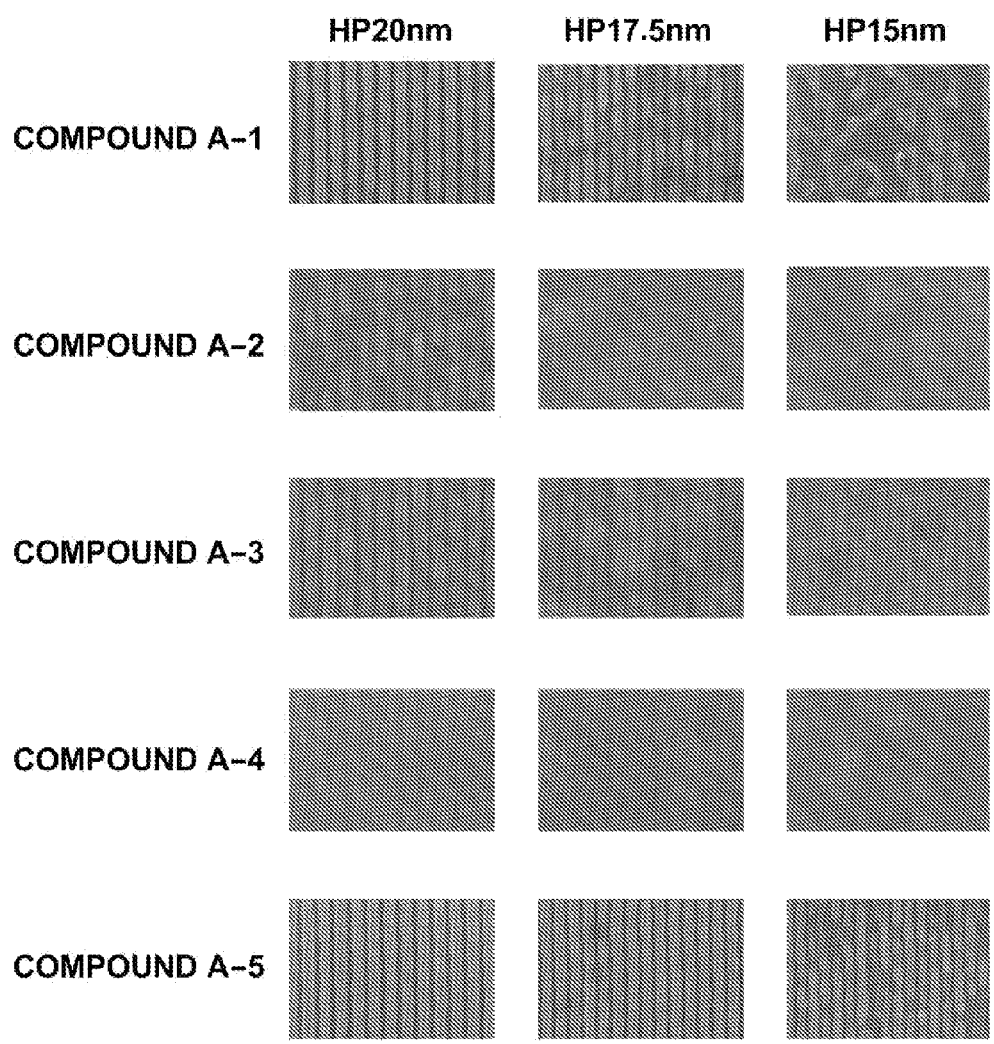

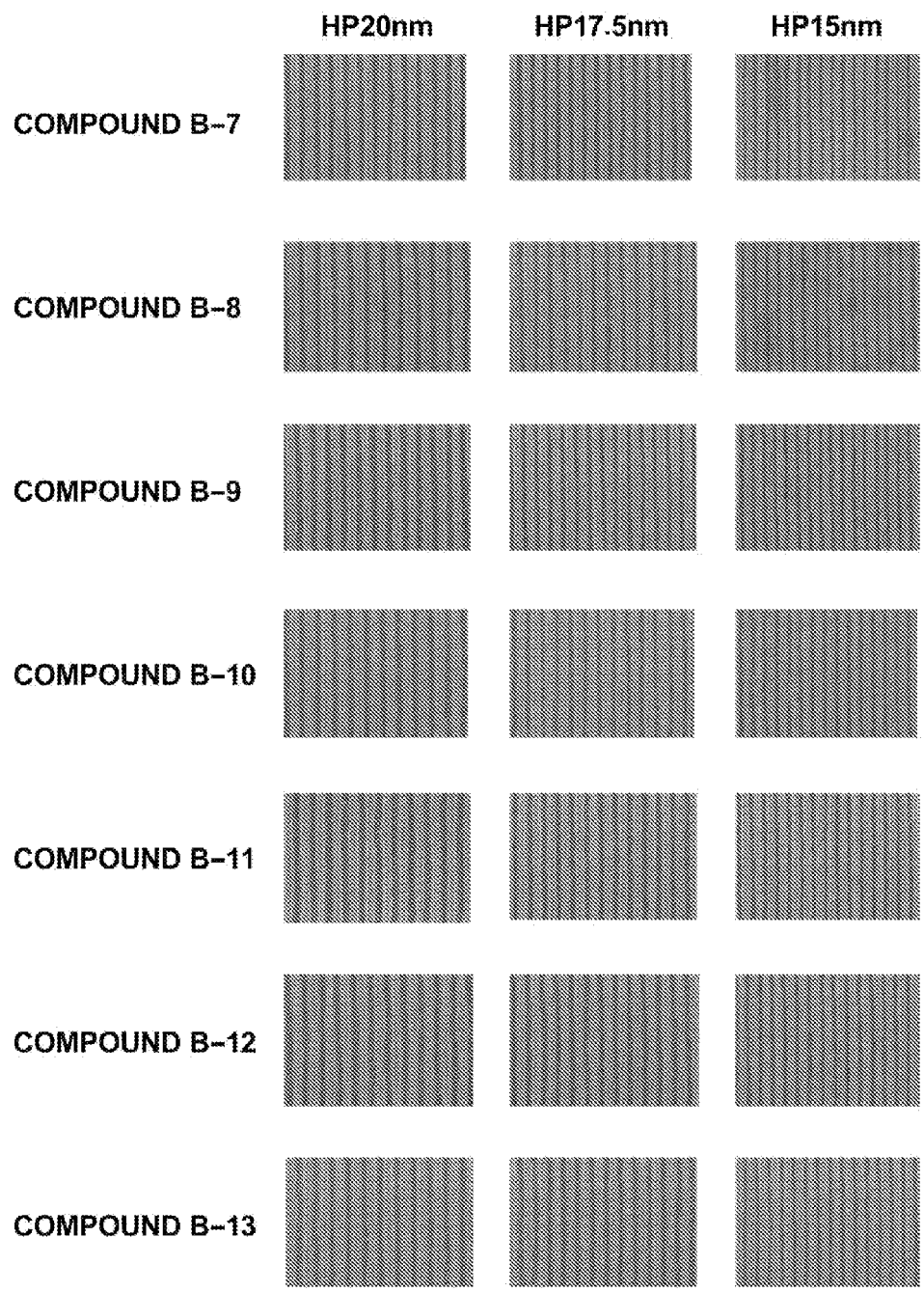

METHOD FOR DEVELOPING RESIST, METHOD FOR FORMING A RESIST PATTERN, METHOD FOR PRODUCING A MOLD, AND DEVELOPING FLUID UTILIZED IN THESE METHODS

CROSS REFERENCE TO RELATED APPLICATIONS

The present application is a Continuation of PCT International Application No. PCT/JP2013/002011 filed on Mar. 25, 2013, which claims priority under 35 U.S.C. §119(a) to Japanese Patent Application No. 2012-078659 filed on Mar. 30, 2012. Each of the above applications is hereby expressly incorporated by reference in its entirety, into the present application.

TECHNICAL FIELD

The present invention is related to a method for developing resist to form a fine pattern on a substrate, a method for forming a resist pattern, a method for producing a mold, and a developing fluid which is utilized in these methods.

BACKGROUND ART

Nanoimprinting is a pattern forming technique that presses a mold (commonly referred to as a mold, a stamper, or a template), on which a pattern of protrusions and recesses is formed, against resist coated on a substrate, which is an object to be processed. Pressing of the original onto the resist causes the resist to mechanically deform or to flow, to precisely transfer a fine pattern. If a mold is produced once, nano level fine structures can be repeatedly molded in a simple manner. Therefore, the nanoimprinting method is an economical transfer technique that produces very little harmful waste and discharge. Therefore, there are high expectations with regard to application of the nanoimprinting method in various fields.

Technical developments are actively being pursued in the application of nanoimprinting to the fields of semiconductor and hard disk production, due to the advantages described above. Formation of super fine patterns on a ten and several nm scale is required in the production of next generation semiconductors and hard disks. There are reports that a high resolution of a 15 nm scale will be necessary by 2015, in ITRS (International Technology Roadmap for Semiconductors) 2011, for example.

Accordingly, in the production of a mold having such a super fine pattern, main chain breaking resists having a copolymer of an α-chloroacrylate ester compound and an α-methylstyrene compound as a main component (ZEP520A by Nippon Zeon Co., Ltd., for example) are widely utilized as a non chemically amplified resist that facilitates obtainment of high resolution. In a main chain breaking resist, the main chain of a polymer is broken by exposure to radiation such as an electron beam, and the molecular weight decreases only at portions that have been exposed. Accordingly, patterns are formed by a difference in dissolution rates of the exposed portions and unexposed portions with respect to with respect to a solvent, in the case that such a resist is utilized.

For example, n amyl acetate, which is a carboxylic acid ester solvent having an alkyl group (e.g., ZED-N50 of Nippon Zeon Co., Ltd.) is widely used as a developing fluid for a resist such as that described above. Further, propylene glycol monomethyl ether acetate (PGMEA), which is a carboxylic acid ester solvent having an alkoxy group (Japanese Patent No. 3779882), and a solvent having the chemical structure of at least two of the phenyl group acid group, a ketone group, and ether group (Japanese Unexamined Patent Publication No. 2006-227174) are also known as developing fluids.

Meanwhile, cold temperature development is known as a developing method having high resolution (Japanese Unexamined Patent Publication No. 2011-215242, L. E. Ocola and A. Stein, "Effect of cold development on improvement in electron-beam nanopatterning resolution and line roughness", Journal of Vacuum Science & Technology B, Vol. 24, No. 6, pp. 3061-3065, 2006 and H. Wang et al., "Low temperature ZEP-520A development process for enhanced critical dimension realization in reactive ion etch etched polysilicon", Journal of Vacuum Science & Technology B, Vol. 25, No. 1, pp. 102-105, 2007). Cold temperature development executes development while maintaining developing fluid in a cold temperature state within a range from 0° C. to approximately 5° C.

DISCLOSURE OF THE INVENTION

However, more than 20 and several nm scale is the limit of possible resolution for the n acetate amyl and the developing fluids disclosed in Japanese Patent No. 3779882 and Japanese Unexamined Patent Publication No. 2006-227174. Therefore, forming finer resist patterns is difficult. It is possible to improve resolution to a scale of a half-pitch (HP) of approximately 18 nm, by cold temperature development. However, further improvement is difficult. Further, when actually executing cold temperature development, it is necessary to maintain not only the developing fluid, but also a target of development and the ambient environment, such as a developing device, at a cold temperature. Therefore, there is a problem that equipment cost will increase.

The results of development when n amyl acetate, and the developing fluids disclosed in Japanese Patent No. 3779882 and Japanese Unexamined Patent Publication No. 2006-227174 were actually utilized, as well as development results when cold temperature development was executed using n amyl acetate are shown in FIG. 1. FIG. 1 illustrates SEM (Scanning Electron Microscope) images of resist patterns which were obtained as a result of executing each of the above development processes. It can be understood from FIG. 1 that it is difficult to achieve a resolution of less than HP 18 nm by the above development methods. Note that the name and characteristics of each compound are shown in Table 1.

TABLE 1

| Compound No. | Name | Feature | Molecular Formula | Molecular Weight | Compound Structure |
|---|---|---|---|---|---|
| A-1 | Amyl Acetate (Pentyl Acetate) | Straight Chain | $C_7H_{14}O_2$ | 130.187 | |

TABLE 1-continued

| Compound No. | Name | Feature | Molecular Formula | Molecular Weight | Compound Structure |
|---|---|---|---|---|---|
| A-2 (Japanese Patent No. 3779882) | Propylene Glycol Monomethyl Ether Acetate (PGMEA) | Branched | $C_6H_{12}O_3$ | 132.159 | |
| A-3 (Japanese Unexamined Patent Publication No. 2006-227174) | Phenyl Aceto Aldehyde Dimethyl Acetal | Ring | $C_{10}H_{14}O_2$ | 166.22 | |
| A-4 (Japanese Unexamined Patent Publication No. 2006-227174) | Diethylene Glycol Monoethyl Ether Acetate | Straight Chain | $C_8H_{16}O_4$ | 176.212 | |
| A-5 (Japanese Unexamined Patent Publication No. 2011-215242) | Amyl Acetate (Cold Temperature 4° C.) | Straight Chain | $C_7H_{14}O_2$ | 130.187 | |

The present invention has been developed in view of the foregoing problems. It is an object of the present invention to provide a method for developing a non chemically amplified resist which is capable of forming super fine resist patterns without maintaining a low temperature, a method for forming a resist pattern, and a developing fluid which is utilized in these methods.

It is another object of the present invention to provide a method for producing a mold capable of forming a super fine pattern of protrusions and recesses.

A method for developing resist of the present invention that achieves the above object is a method for developing a non chemically amplified resist that employs a developing fluid having a carboxylic acid compound, which is a carboxylic acid ester having branched chain alkyl groups and a total carbon number of 8 or greater, as a main component.

A method for forming a resist pattern of the present invention is a method for forming a resist pattern constituted by a non chemically amplified resist, comprising:

coating the resist on a substrate to form a resist film on the substrate;

exposing a predetermined pattern portion of the resist film; and developing the resist film employing a developing fluid having a carboxylic acid compound, which is a carboxylic acid ester having branched chain alkyl groups and a total carbon number of 8 or greater, as a main component.

A method for producing a mold of the present invention is a method for producing a mold having a fine pattern of protrusions and recesses on a surface thereof, comprising:

coating a non chemically amplified resist on a substrate to form a resist film on the substrate;

exposing a predetermined pattern portion of the resist film corresponding to a pattern of protrusions and recesses to be formed;

developing the resist film employing a developing fluid having a carboxylic acid compound, which is a carboxylic acid ester having branched chain alkyl groups and a total carbon number of 8 or greater, as a main component; and etching the substrate using the developed resist film as a mask.

The developing fluid of the present invention is a developing fluid which is utilized to develop a non chemically amplified resist, and has a carboxylic acid compound, which is a carboxylic acid ester having branched chain alkyl groups and a total carbon number of 8 or greater, as a main component.

In the method for developing resist, the method for forming a resist pattern, the method for producing a mold, and the developing fluid to be utilized in these methods of the present invention, it is preferable for the total carbon number of the carboxylic acid compound to be 20 or less. Further, in this case, it is preferable for the carboxylic acid compound to be at least one of isobutyl butyrate, butyl isobutyrate, isobutyl isobutyrate, isoamyl isobutyrate, and 2-methylbutyrate 2-methylbutyl. In addition, it is preferable for the non chemically amplified resist to be a resist having a copolymer of an α-chloroacrylate ester compound and an α-methylstyrene compound as a main component.

In the method for developing resist, the method for forming a resist pattern, and the developing fluid to be utilized in these methods of the present invention, the main component of the developing fluid is a carboxylic acid compound, which is a carboxylic acid ester having branched chain alkyl groups and a total carbon number of 8 or greater. Therefore, formation of super fine resist patterns becomes possible without maintaining a cold temperature when developing a non chemically amplified resist.

In addition, in the method for producing a mold of the present invention, etching is performed using the super fine resist pattern which is formed in the manner described above. Therefore, it becomes possible to form a super fine pattern of protrusions and recesses when producing a mold.

BRIEF DESCRIPTION OF THE DRAWINGS

FIG. 1 is a collection of diagrams that illustrate electron microscope images of resist patterns formed by utilizing the compounds of Table 1 as developing fluids.

FIG. 2B is a collection of diagrams that illustrate electron microscope images of resist patterns formed by utilizing the compounds of Table 2 as developing fluids.

BEST MODE FOR CARRYING OUT THE INVENTION

Figure 2A:
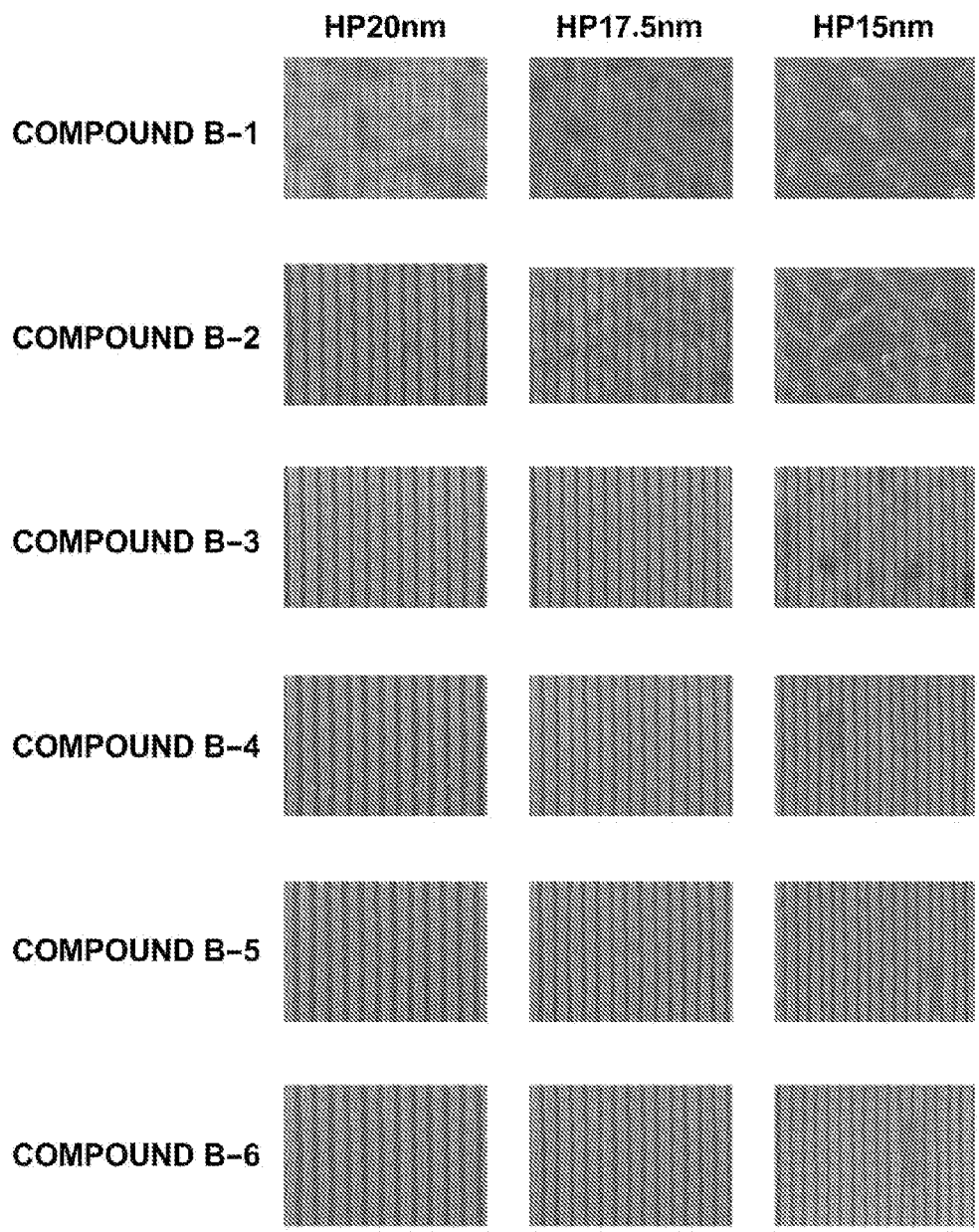
FIG. 2A is a collection of diagrams that illustrate electron microscope images of resist patterns formed by utilizing the compounds of Table 2 as developing fluids.

Embodiments of the present invention will be described with reference to the attached drawings. However, the present invention is not limited to the embodiments to be described hereinafter. Note that the scale of each constituent element in the drawings is changed as appropriate from the actual dimensions thereof, in order to facilitate visual recognition thereof. "Method for Developing Resist, Method for Forming Resist Pattern, and Developing Fluid Utilized in these Methods"

A method for developing resist of the present embodiment is a method for developing a non chemically amplified resist, employing a developing fluid having a carboxylic acid compound, which is a carboxylic acid ester having branched chain alkyl groups and a total carbon number of 8 or greater, as a main component. That is, the method for developing resist performs development utilizing a developing fluid of the present invention.

In addition, the method for forming a resist pattern of the present embodiment is a method for forming a resist pattern constituted by a non chemically amplified resist, and comprises: coating the resist on a substrate to form a resist film on the substrate; exposing a predetermined pattern portion of the resist film; and developing the resist film employing a developing fluid having a carboxylic acid compound, which is a carboxylic acid ester having branched chain alkyl groups and a total carbon number of 8 or greater, as a main component. That is, the method for forming a resist pattern applies the method for developing resist onto the non chemically amplified resist film.

<Resist>

The non chemically amplified resist is not particularly limited, but it is preferable for the non chemically amplified resist to be a main chain breaking resist. It is more preferable for the non chemically amplified resist to be a resist having a copolymer of an α-chloroacrylate ester compound and an α-methylstyrene compound as a main component.

Resist having a copolymer of an α-chloroacrylate ester compound and an α-methylstyrene compound as a main component is known as a non chemically amplified positive type radiation resist. That is, the above resist constitutes a reaction system in which solubility with respect to developing fluid is improved by polymer chains of the copolymer being broken by irradiation of radiation (exposure), and the molecular weight thereof being changed thereby. Accordingly, if the above resist is utilized, the difference in solubility of the resist at exposed portions and unexposed portions becomes contrast in the pattern, and the resist pattern is formed thereby. That the copolymer is a "main component" of the resist means that the copolymer component constitutes 90% by weight or greater of the resist. Generally, positive type radiation resist can include surfactants and the like, in addition to a main component. The resist may be adjusted to a desired viscosity by being diluted with anisole or the like.

The "α-chloroacrylate ester compound" includes α-chloroacrylate ester compounds and derivatives thereof. Examples of α-chloroacrylate ester derivatives that may be employed include: α-chloroacrylate 2,2,2-trichloroethyl ester, α-chloroacrylate 2,2,3,3,3-pentachloropropyl ester and α-chloroacrylate pentachlorophenyl ester. The "α-methylstyrene compound" includes α-methylstyrene compounds and derivatives thereof. Examples of α-methylstyrene derivatives that may be employed include: 4-chloro-α-methylstyrene and 3,4-dichloro-α-methylstyrene. A copolymer of α-chloroacrylate ester and α-methylstyrene is preferred as the above copolymer, from the viewpoint of obtaining high resolution and etching resistance.

The weight average molecular weight of the above copolymer is preferably within a range from 10000 to 1000000, more preferably within a range from 30000 to 120000, and particularly preferably within a range from 50000 to 70000. This is because the solubility with respect to the developing fluid will become excessively high if the above copolymer has a small weight average molecular weight, resulting in cases in which the contrast of the resist pattern will decrease. The weight average molecular weight is a polystyrene converted value by gel permeation chromatography. Tetrahydrofuran is employed as a column solvent.

ZEP520A of Nippon Zeon Co., Ltd. may be utilized as a resist that satisfies the above requirements.

<Substrate>

The substrate is a member that will become the base of the mold. The material of the substrate is not particularly limited, and silicon, silicon oxide, quartz, etc. may be utilized, for example. A silicon wafer, or a quartz substrate having a hard mask formed by chromium or the like may be utilized as the substrate, for example.

<Coating of the Resist>

The method by which the resist is coated is not particularly limited, and known methods may be utilized. For example, the resist film may be formed on the substrate by the spin coat method. The thickness of the resist film is adjusted as appropriate within a range form 15 nm to 100 nm, and more preferably within a range from 20 nm to 40 nm, according to exposure and development conditions.

<Exposure>

The exposure is performed using an ultraviolet ray irradiating apparatus (an exposure apparatus having an aligner, a stepper, or an excimer laser as a light source), an electron beam exposure apparatus, and an X ray exposure apparatus, for example. An electron beam exposure apparatus capable of irradiating spot beams or variable shaped beams are particularly preferable.

<Development>

The development method is not particularly limited, and the puddle method, the dip method, the spray method, and the like may be utilized, for example.

The present invention utilizes a developing fluid having a carboxylic acid compound, which is a carboxylic acid ester having branched chain alkyl groups and a total carbon number of 8 or greater, as a main component. That the carboxylic acid compound is the "main component" of the developing fluid means that the carboxylic acid compound component constitutes 90% by weight or greater of the developing fluid. Note that it is not necessary for the carboxylic acid compound to be a single type of compound, and may be a mixture of a plurality of types of compounds having different total carbon numbers. In this case, the carboxylic acid compound as a whole may constitute the main component of the developing fluid. Generally, developing fluid can include surfactants and the like, in addition to a main component.

A carboxylic acid compound, which is a carboxylic acid ester having branched chain alkyl groups and a total carbon number of 8 or greater is represented by General Formula 1 below.

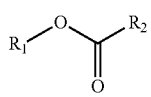

General Formula 1

In General Formula 1, $R_1$ and $R_2$ are both alkyl groups, at least one of which has a branched structure. Further, the total number of carbon atoms between $R_1$ and $R_2$ is 7 or greater. That is, the compound needs only to have an alkyl group with a branched structure as at least one of $R_1$ and $R_2$. Whether an alkyl group has a branched structure can be judged based on the number of carbon atoms which are bound adjacent to a carbon atom. That is, it can be said that an alkyl group has a branched structure when a carbon atom having three carbon atoms bound adjacent thereto (a tertiary carbon atom) or a carbon atom having four carbon atoms bound adjacent thereto (a quaternary carbon atom) is present in the alkyl group.

It is preferable for the total carbon number of the carboxylic acid compound to be 20 or less, from the viewpoint of sensitivity.

A carboxylic acid compound having a total carbon number of 8 is represented by molecular formula $C_8H_{16}O_2$, for example. Examples of such a compound include: isobutyl butyrate, butyl isobutyrate, and isobutyl isobutyrate.

A carboxylic acid compound having a total carbon number of 9 is represented by molecular formula $C_9H_{18}O_2$, for example. Examples of such a compound include: isoamyl isobutyrate, isobutyl 2-methylbutyrate, and isopropyl 3-methylpentanoate.

A carboxylic acid compound having a total carbon number of 10 is represented by molecular formula $C_{10}H_{20}O_2$, for example. Examples of such a compound include: 2-methylbutyl 2-methylbutyrate, isobutyl 2-methylpentanoate, and 2-ethylhexyl acetate.

A carboxylic acid compound having a total carbon number of 11 is represented by molecular formula $C_{11}H_{22}O_2$, for example. Examples of such a compound include: 2,2-dimethylpropyl 2,2-dimethylbutyrate, tert-butyl 2-methylhexanoate, and 1-isobutyl-3-methylbutyl acetate.

A carboxylic acid compound having a total carbon number of 12 is represented by molecular formula $C_{12}H_{24}O_2$, for example. Examples of such a compound include: 1,1-dimethylpentyl 2,2-dimethylpropanoate, 2-ethylbutyl 2-ethylbutyrate, and 1-methylethyl 3,5,5-trimethylhexanoate The development time is adjusted as appropriate within a range from 5 to 200 seconds, for example, and more preferably within a range from 15 to 90 seconds. In addition, the development temperature is adjusted as appropriate within a range from 18° C. to 30° C., for example, and more preferably approximately 23° C. A rinsing process may be executed after development. Methyl isobutyl ketone (MIBK) or isopropyl alcohol (IPA) or a mixture thereof may be utilized as a rinsing solution.

According to the present invention, as will be shown in the examples to be described later, it is possible to form a super fine pattern on a 15 nm scale by developing the non-chemically amplified resist without maintaining a cold temperature. The detailed mechanism of why formation of the super fine pattern is possible by using the developing fluid of the present invention is unknown. However, there is a possibility that the following phenomena operate to improve resolution.

Conventionally, the main cause of the limit of resolution of main chain breaking resist had been considered to be that macromolecular aggregates having diameters within a range from 20 nm to 30 nm are present within resist films, and that these aggregates undergo desorption during development, becoming exposed at the side walls of patterns and causing fluctuations in dimensions, and inhibiting super fine pattern formation as a result. For this reason, use of a solvent having a low total carbon number (that is, a low molecular weight) as a developing fluid has been proposed, in order to promote dissolution of the aggregates themselves (T. Yamaguchi and H. Namatsu, "Effect of developer molecular size on roughness of dissolution front in electron-beam resist", *Journal of Vacuum Science & Technology B*, Vol. 22, No. 3, pp. 1037-1043, 2004, for example).

However, as a result of intense focused research, the present inventors have found that the influence of aggregate desorption on the main cause of the limit of resolution is small, and further, that by decreasing the molecular weight of developing fluid as disclosed in the above non patent document, the dissolution speed will increase, resulting in a decrease in solubility contrast (the difference between the dissolution speed of unexposed portions and the dissolution speed of exposed portions), which has an adverse effect on resolution.

It is considered that in the present invention, the dissolution speed of the resist decreases and the solubility contrast increases as a result of a solvent, which is the main component of the developing fluid, having a complex branched structure and a total carbon number of 8 or greater. That the solubility contrast increases is considered to be due to the dissolution speed of unexposed portions and exposed portions not decreasing uniformly, but decreasing more at the unexposed portions due to penetration of the solvent into the unexposed portions of the resist being suppressed compared to penetration of the solvent into the exposure portion as a result of the complex structure described above. It is considered that contrast of the pattern of the unexposed portions and the exposed portions is more readily generated as a result. Further, because penetration of the solvent into unexposed portions of the resist is suppressed, decrease in pattern strength is suppressed, and it is considered that another great advantageous effect, that the pattern will become less likely to collapse, is obtained (refer to the Examples). It is considered that formation of resist patterns which are even finer than those obtained by maintaining a cold temperature becomes possible as a result.

"Method for Producing a Mold"

Next, a method for producing a mold according to an embodiment will be described. A mold will be produced in the present embodiment, by employing the method for producing a resist pattern described above.

A method for producing a mold of the present embodiment is a method for producing a mold having a fine pattern of protrusions and recesses on a surface thereof, comprising: coating a non chemically amplified resist on a substrate to form a resist film on the substrate; exposing a predetermined pattern portion of the resist film corresponding to a pattern of protrusions and recesses to be formed; developing the resist film employing a developing fluid having a carboxylic acid compound, which is a carboxylic acid ester having branched chain alkyl groups and a total carbon number of 8 or greater, as a main component; and etching the substrate using the developed resist film as a mask.

That is, the above method for producing a mold etches the substrate using the resist film, on which a predetermined pattern of protrusions and recesses is formed by the method for forming a resist pattern described above, as a mask. As a result, a pattern of protrusions and recesses corresponding to the resist pattern is formed on the surface of the substrate. For example, such a mold may be utilized as a nanoimprinting mold itself, or utilized as an original for copying such a mold by the electroplating method, for example.

The etching method is not particularly limited as long as it can form a pattern of protrusions and recesses on a substrate, and can be appropriately selected depending on the intended purpose. Examples of etching methods include: reactive ion etching (RIE), the ion milling method, and sputter etching, for example. Among these, RIE and the ion milling method are particularly preferable.

The etchant for RIE is selected as appropriate depending on the material of the substrate. If the substrate is a silicon wafer, it is possible to use a fluorine series gas or a chlorine series gas, for example.

As described above, according to the method for producing a mold of the present invention, the substrate is etched using the super fine resist pattern formed as described above as a mask. Therefore, it becomes possible to form a super fine pattern of protrusions and recesses when producing a mold.

EXAMPLES

Examples of the method for developing resist, the method for forming a resist pattern, and the developing fluid which his utilized in these methods of the present invention will be described below.

<Formation of Resist Film and Exposure>

First, a resist was prepared by diluting ZEP520A by Nippon Zeon Co., Ltd. with anisole. Then, the resist was applied by spin coating on an eight inch silicon wafer, and a resist film having a thickness of 30 nm was formed on the silicon wafer. Then, using a 50 kV accelerated voltage spot beam electron beam exposure apparatus JBX-6000FS/E by Nippon Electronics Co., Ltd., line and space patterns having a half-pitch (line width) within a range from 15 nm to 50 nm were drawn on the resist film.

<Development>

Each of the 13 types of carboxylic acid compounds shown in Table 2 below was utilized as a developing fluid, to develop the resist film. The development time was set to 30 seconds. A rinsing process using IPA and a drying process using a spin dry apparatus were performed after development.

TABLE 2

| Compound No. | Name | Structure of Alkyl Group | Molecular Formula | Molecular Weight | Compound Structure |
|---|---|---|---|---|---|
| B-1 | Butyl Acetate | Straight Chain | $C_6H_{12}O_2$ | 116.16 | |
| B-2 | Amyl Acetate (Pentyl Acetate) | Straight Chain | $C_7H_{14}O_2$ | 130.187 | |
| B-3 | Hexyl Acetate | Straight Chain | $C_8H_{16}O_2$ | 144.214 | |
| B-4 | Heptyl Acetate | Straight Chain | $C_9H_{18}O_2$ | 158.241 | |
| B-5 | Octyl Acetate | Straight Chain | $C_{10}H_{20}O_2$ | 172.268 | |
| B-6 | Nonyl Acetate | Straight Chain | $C_{11}H_{22}O_2$ | 186.295 | |
| B-7 | Decyl Acetate | Straight Chain | $C_{12}H_{24}O_2$ | 200.322 | |
| B-8 | Butyl Butyrate | Straight Chain | $C_8H_{16}O_2$ | 144.214 | |

TABLE 2-continued

| Compound No. | Name | Structure of Alkyl Group | Molecular Formula | Molecular Weight | Compound Structure |
|---|---|---|---|---|---|
| B-9 | Isobutyl Butyrate | Branched | $C_8H_{16}O_2$ | 144.214 | |
| B-10 | Butyl Isobutyrate | Branched | $C_8H_{16}O_2$ | 144.214 | |
| B-11 | Isobutyl Isobutyrate | Branched | $C_8H_{16}O_2$ | 144.214 | |
| B-12 | Isoamyl Isobutyrate | Branched | $C_9H_{18}O_2$ | 158.241 | |
| B-13 | 2-methylbutyl 2-methylbutyrate | Branched | $C_{10}H_{20}O_2$ | 172.268 | |

<Evaluations>

The resist patterns were observed using an electron microscope capable of observing critical dimensions (CD-SEM) to evaluate to what scale resist patterns were formed without defects.

<Results>

FIG. 2A and FIG. 2B are collections of diagrams that illustrate SEM images of resist patterns formed by utilizing each of the carboxylic acid compounds of Table 2 as developing fluids. From FIG. 2A and FIG. 2B, it can be understood that it is possible to form super fine resist patterns without maintaining a cold temperature, in cases that developing fluids of the present invention (Compounds 9 through 13) are utilized. In addition, it can also be understood that collapsing of patterns was confirmed in the cases that Compounds 4 through 7 are utilized, but that such collapsing of patterns did not occur in cases that that developing fluids of the present invention (Compounds 9 through 13) are utilized.

What is claimed is:

1. A method for developing a main chain breaking non chemically amplified resist that employs a developing fluid having a carboxylic acid compound, which is a carboxylic acid ester having branched chain alkyl groups and a total carbon number of 8 or greater, as a main component.

2. A method for developing a non chemically amplified resist as defined in claim 1, wherein:
the total carbon number of the carboxylic acid compound is 20 or less.

3. A method for developing a non chemically amplified resist as defined in claim 2, wherein:
the carboxylic acid compound is at least one of isobutyl butyrate, butyl isobutyrate, isobutyl isobutyrate, isoamyl isobutyrate, and 2-methylbutyl 2-methylbutyrate.

4. A method for developing a non chemically amplified resist as defined in claim 1, wherein:
the non chemically amplified resist is a resist having a copolymer of an α-chloroacrylate ester compound and an α-methylstyrene compound as a main component.

5. A method for producing a mold having a fine pattern of protrusions and recesses on a surface thereof, comprising:
coating a main chain breaking non chemically amplified resist on a substrate to form a resist film on the substrate;
exposing a predetermined pattern portion of the resist film corresponding to a pattern of protrusions and recesses to be formed;
developing the resist film employing a developing fluid having a carboxylic acid compound, which is a carboxylic acid ester having branched chain alkyl groups and a total carbon number of 8 or greater, as a main component; and
etching the substrate using the developed resist film as a mask.

6. A method for producing a mold as defined in claim 5, wherein:
the total carbon number of the carboxylic acid compound is 20 or less.

7. A method for producing a mold as defined in claim 6, wherein:
the carboxylic acid compound is at least one of isobutyl butyrate, butyl isobutyrate, isobutyl isobutyrate, isoamyl isobutyrate, and 2-methylbutyl 2-methylbutyrate.

8. A method for producing a mold as defined in claim 5, wherein:
the non chemically amplified resist is a resist having a copolymer of an α-chloroacrylate ester compound and an α-methylstyrene compound as a main component.

9. A developing fluid which is utilized to develop a main chain breaking non chemically amplified resist, having a carboxylic acid compound, which is a carboxylic acid ester having branched chain alkyl groups and a total carbon number of 8 or greater, as a main component.

10. A developing fluid as defined in claim 9, wherein:
the total carbon number of the carboxylic acid compound is 20 or less.

11. A developing fluid as defined in claim 10, wherein:
the carboxylic acid compound is at least one of isobutyl butyrate, butyl isobutyrate, isobutyl isobutyrate, isoamyl isobutyrate, and 2-methylbutyl 2-methylbutyrate.

12. A method for developing a non chemically amplified resist as defined in claim 1, wherein:
the total carbon number of the carboxylic acid compound is 9 or greater.

13. A method for developing a non chemically amplified resist as defined in claim 1, wherein:
the total carbon number of the carboxylic acid compound is 10 or greater.

14. A method for developing a non chemically amplified resist as defined in claim 1, wherein:
the carboxylic acid compound is represented by General Formula 1 below where $R_2$ is an alkyl groups with a branched structure having a carbon number of 3 or greater

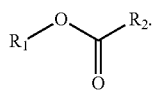

General Formula 1

15. A method for producing a mold as defined in claim 5, wherein:
the total carbon number of the carboxylic acid compound is 9 or greater.

16. A method for producing a mold as defined in claim 5, wherein:
the total carbon number of the carboxylic acid compound is 10 or greater.

17. A method for producing a mold as defined in claim 5, wherein:
the carboxylic acid compound is represented by General Formula 1 below where $R_2$ is an alkyl groups with a branched structure having a carbon number of 3 or greater

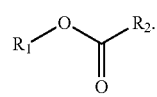

General Formula 1

18. A developing fluid as defined in claim 9, wherein:
the total carbon number of the carboxylic acid compound is 9 or greater.

19. A developing fluid as defined in claim 9, wherein:
the total carbon number of the carboxylic acid compound is 10 or greater.

20. A developing fluid as defined in claim 9, wherein:
the carboxylic acid compound is represented by General Formula 1 below where $R_2$ is an alkyl groups with a branched structure having a carbon number of 3 or greater

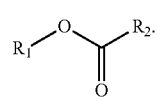

General Formula 1

* * * * *